(12) United States Patent
Murakami et al.

(10) Patent No.: US 10,546,741 B2
(45) Date of Patent: Jan. 28, 2020

(54) SELECTIVE GROWTH METHOD

(71) Applicant: TOKYO ELECTRON LIMITED, Tokyo (JP)

(72) Inventors: Hiroki Murakami, Nirasaki (JP); Akira Shimizu, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/926,405

(22) Filed: Mar. 20, 2018

(65) Prior Publication Data
US 2018/0286667 A1 Oct. 4, 2018

(30) Foreign Application Priority Data
Mar. 30, 2017 (JP) ................. 2017-066859

(51) Int. Cl.
C23C 16/40 (2006.01)
H01L 21/02 (2006.01)
H01L 21/285 (2006.01)

(52) U.S. Cl.
CPC .... H01L 21/02164 (2013.01); H01L 21/0217 (2013.01); H01L 21/0228 (2013.01); H01L 21/02211 (2013.01); H01L 21/28562 (2013.01)

(58) Field of Classification Search
CPC ........... H01L 21/02164; H01L 21/0217; H01L 21/28562; H01L 21/0228; H01L 21/02211;
(Continued)

(56) References Cited

U.S. PATENT DOCUMENTS 5,429,983 A * 7/1995 Takizawa .......... G02F 1/136286
117/105
7,790,631 B2 * 9/2010 Sharma ................. H01L 21/022
438/780
(Continued)

FOREIGN PATENT DOCUMENTS

JP 2009-231836 A 10/2009
JP 2014-175337 A 9/2014
JP 2016-86145 A 5/2016

OTHER PUBLICATIONS

Mameli, Alfredo, et al., "Area-Selective Atomic Layer Deposition of SiO2 Usign Acetylacetone as a Chemoselective Inhibitor in an ABC-Type Cycle". ACS Nano 2017, 11 9303-0311.*
(Continued)

Primary Examiner — Bret P Chen
(74) Attorney, Agent, or Firm — Nath, Goldberg & Meyer; Jerald L. Meyer

(57) ABSTRACT

A selective growth method of selectively growing a thin film on an underlayer, on which an insulating film and a conductive film are exposed, includes: preparing a workpiece having the underlayer on which the insulating film and the conductive film are exposed; and selectively growing a silicon-based insulating film on the insulating film by repeating a plurality of times a first step of adsorbing an aminosilane-based gas onto the insulating film and the conductive film and a second step of supplying a reaction gas for reacting with the adsorbed aminosilane-based gas to form the silicon-based insulating film, wherein the conductive film is vaporized by reaction with the reaction gas so that the conductive film is reduced in thickness.

15 Claims, 16 Drawing Sheets

(58) Field of Classification Search
CPC . C23C 16/14; C23C 16/402; C23C 16/45525; C23C 16/40
See application file for complete search history.

(56) References Cited

U.S. PATENT DOCUMENTS

| | | | | |
|---|---|---|---|---|
| 7,985,669 | B2* | 7/2011 | Huotari | H01L 21/28079 257/E21.637 |
| 9,236,292 | B2* | 1/2016 | Romero | H01L 21/76838 |
| 9,349,687 | B1* | 5/2016 | Gates | H01L 23/53223 |
| 9,895,715 | B2* | 2/2018 | Haukka | B05D 3/107 |
| 2011/0156155 | A1* | 6/2011 | Ikeda | G11C 11/4125 257/369 |
| 2015/0170961 | A1* | 6/2015 | Romero | H01L 21/76838 438/641 |
| 2015/0217330 | A1* | 8/2015 | Haukka | B05D 3/107 427/343 |
| 2015/0299848 | A1* | 10/2015 | Haukka | C23C 16/18 427/123 |
| 2016/0148839 | A1* | 5/2016 | Abelson | H01L 21/76879 438/608 |

OTHER PUBLICATIONS

Magagnin, L., et al., "Selective Deposition of Thin Copper Films onto Silicon with Improved Adhesion". Electrochemical and Solid-State Letters, 4 (1) C5-C7 (2001).*

Ting, Chiu H., et al., "Selective Electroless Metal Deposition for Integrated Circuit Fabrication". J. Electrochem. Soc., vol. 136, No. 2, Feb. 1989, pp. 456-462.*

Hashemi, Fatemeh Sadat Minaye, et al., "A New Resist for Area Selective Atomic and Molecular Layer Deposition on Metal-Dielectric Patterns". The Journal of Physical Chemistry C, 2014, 118, 10957-10962.*

* cited by examiner

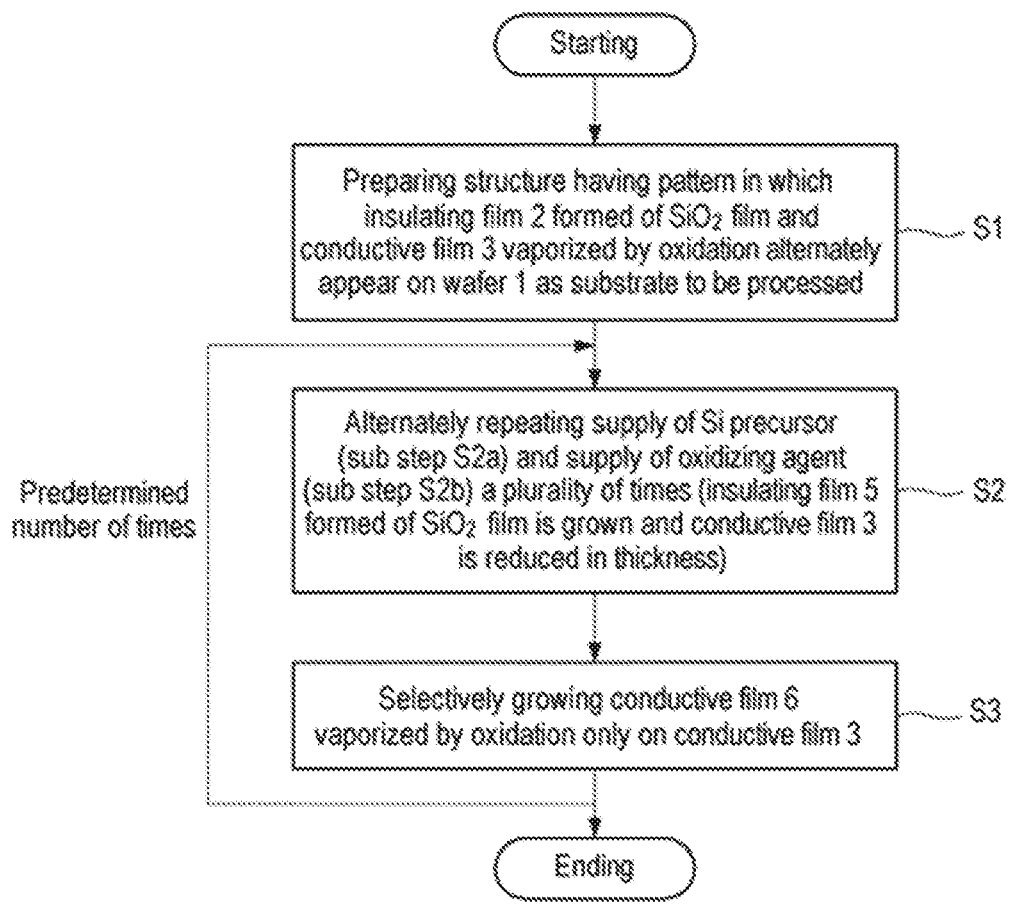

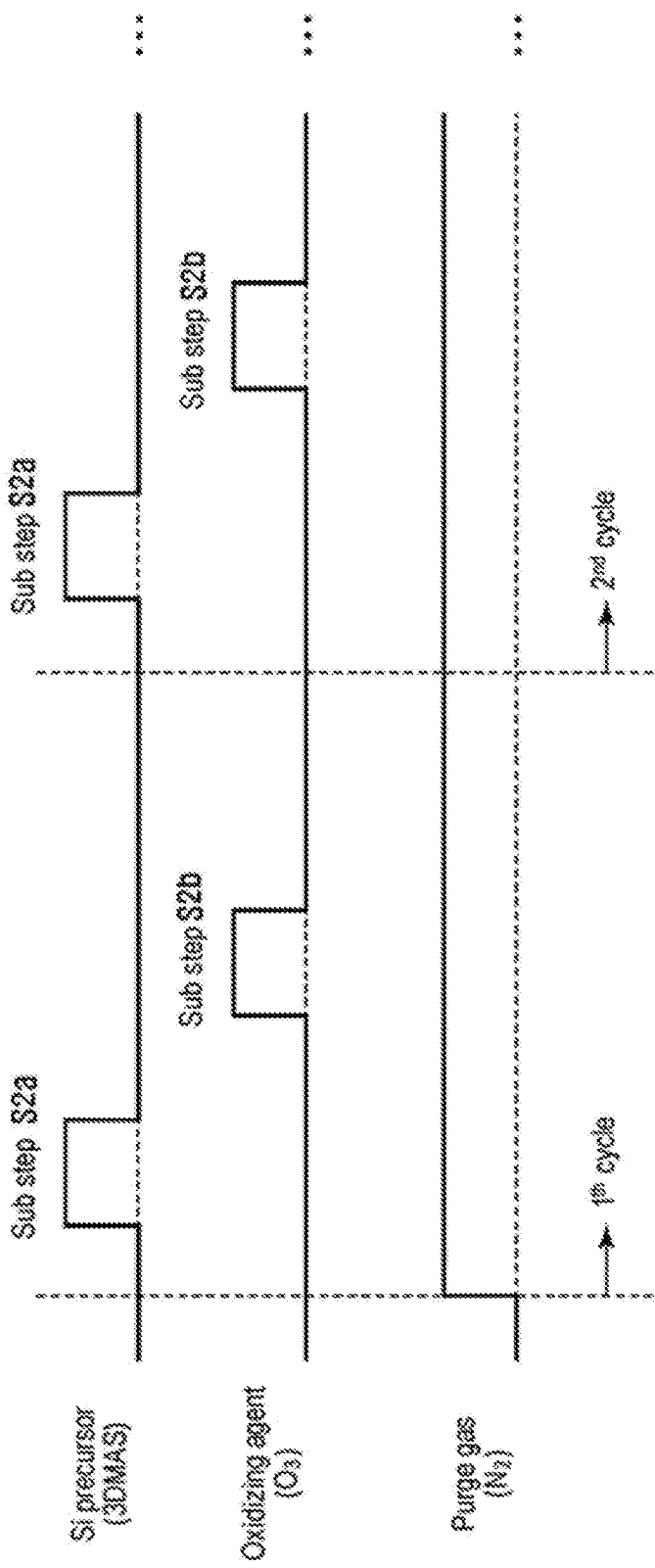

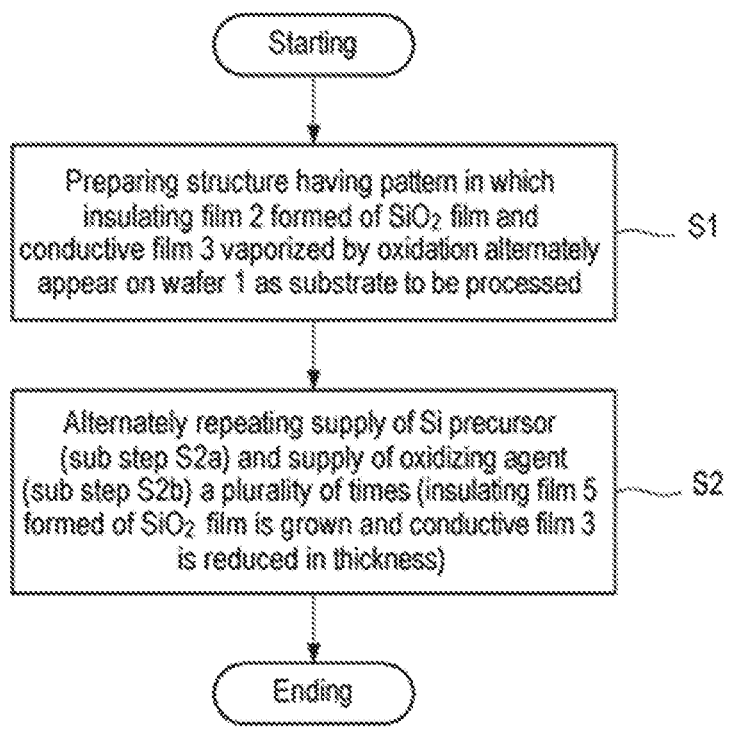

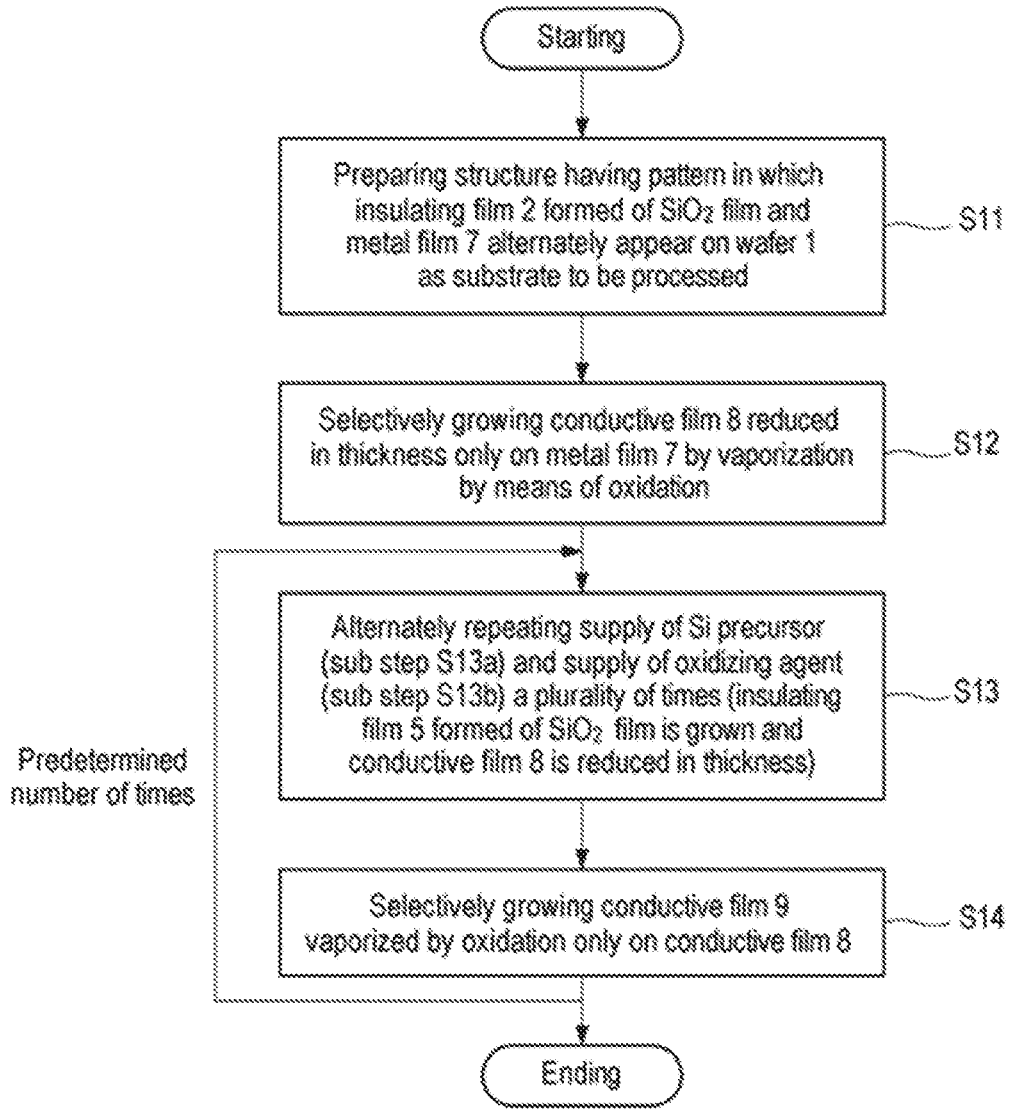

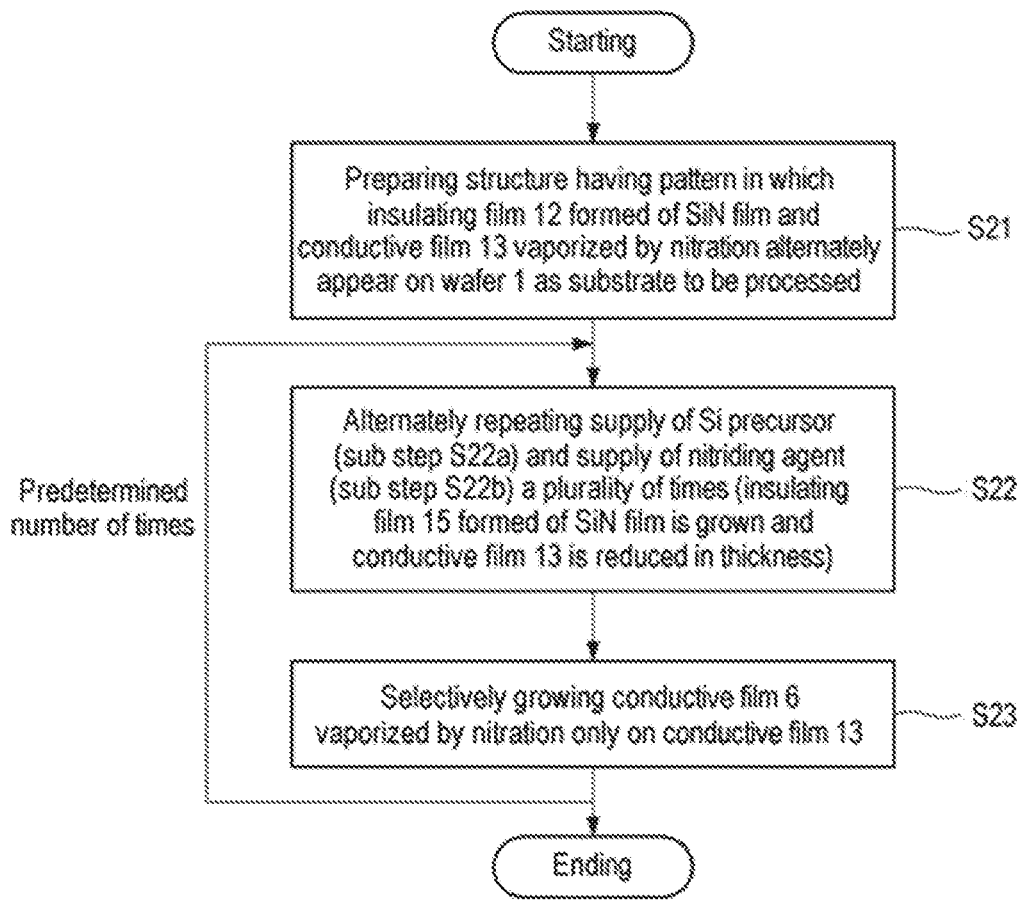

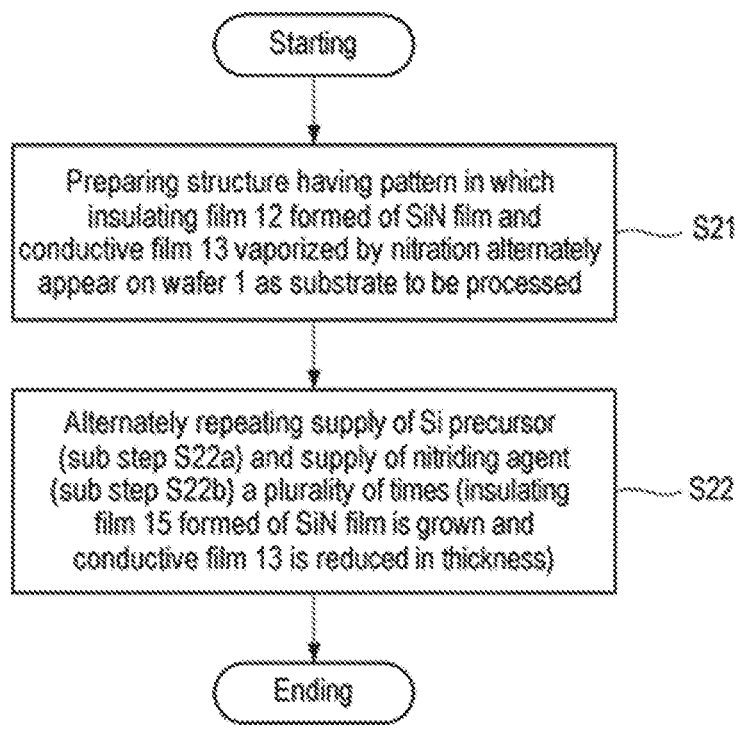

SELECTIVE GROWTH METHOD

CROSS-REFERENCE TO RELATED APPLICATION

This application is based upon and claims the benefit of priority from Japanese Patent Application No. 2017-066859, filed on Mar. 30, 2017, the entire contents of which are incorporated herein by reference.

TECHNICAL FIELD

The present disclosure relates to a selective growth method of selectively growing a thin film on an underlayer on which an insulating film and a conductive film are exposed.

BACKGROUND

As selective growth methods of selectively growing a thin film on an underlayer, a single crystal homoepitaxial growth method and a heteroepitaxial growth method using a plane orientation of an underlying crystal plane are known. For example, a homoepitaxial growth method of growing a silicon epitaxial layer on a single crystal silicon as an underlayer has been used.

Further, for example, a heteroepitaxial growth method of growing a silicon germanium epitaxial layer on a single crystal silicon as an underlayer has been used.

In the homoepitaxial growth method and the heteroepitaxial growth method, there are restrictions that the underlayer to be selectively grown is limited, cleaning of an interface is required, and a high temperature process is required.

In this regard, as a technique without such restrictions, for example, there has been proposed a selective growth method of selectively growing a thin film on an underlayer on which an insulating film and metal are exposed. This method includes a process of selectively growing a film whose thickness is decreased by combustion on the underlying metal using the underlying metal as a catalyst, and a process of selectively growing a silicon oxide film on the underlying insulating film while burning the film whose thickness is decreased by combustion.

In addition, it has been suggested that, when an insulating film selectively grows on another insulating film, an $SiO_2$ film is selectively grown on $SiO_2$ as the insulating film while burning a film whose thickness is decreased by combustion, for example, carbon. However, there are no concrete methods that effectively perform such a selective growth.

SUMMARY

Some embodiments of the present disclosure provide a selective growth method capable of more effectively performing a selective growth of an insulating film, when selectively growing a thin film on an underlayer on which an insulating film and a conductive film are exposed in order to implement a selective growth with respect to a finer semiconductor device structure.

According to one embodiment of the present disclosure, there is provided a selective growth method of selectively growing a thin film on an underlayer on which an insulating film and a conductive film are exposed, the method including: preparing a workpiece having the underlayer on which the insulating film and the conductive film are exposed; and selectively growing a silicon-based insulating film on the insulating film by repeating a plurality of times a first step of adsorbing an aminosilane-based gas onto the insulating film and the conductive film and a second step of supplying a reaction gas for reacting with the adsorbed aminosilane-based gas to form the silicon-based insulating film, wherein the conductive film is vaporized by reaction with the reaction gas so that the conductive film is reduced in thickness.

According to another embodiment of the present disclosure, there is provided a selective growth method of selectively growing a thin film on an underlayer on which an insulating film and a conductive film are exposed, the method including: preparing a workpiece having the underlayer on which the insulating film and the conductive film are exposed; selectively growing a silicon-based insulating film on the insulating film by repeating a plurality of times a first step of adsorbing an aminosilane-based gas onto the insulating film and the conductive film and a second step of supplying a reaction gas for reacting with the adsorbed aminosilane-based gas to form the silicon-based insulating film, wherein the conductive film is vaporized by reaction with the reaction gas so that the conductive film is reduced in thickness; and subsequently, selectively growing the conductive film, wherein the selectively growing a silicon-based insulating film and the selectively growing the conductive film are performed a predetermined number of times.

According to another embodiment of the present disclosure, there is provided a selective growth method of selectively growing a thin film on an underlayer on which an insulating film and a first conductive film are exposed, the method including: preparing a workpiece having the underlayer on which the insulating film and a metal film as the first conductive film are exposed; selectively growing a second conductive film on the metal film; and selectively growing a silicon-based insulating film on the insulating film by repeating a plurality of times a first step of adsorbing an aminosilane-based gas onto the insulating film and the second conductive film and a second step of supplying a reaction gas for reacting with the adsorbed aminosilane-based gas to form the silicon-based insulating film, wherein the second conductive film is vaporized by reaction with the reaction gas so that the second conductive film is reduced in thickness.

According to another embodiment of the present disclosure, there is provided a selective growth method of selectively growing a thin film on an underlayer on which an insulating film and a first conductive film are exposed, the method including: preparing a workpiece having the underlayer on which the insulating film and a metal film as the first conductive film are exposed; selectively growing a second conductive film on the metal film; selectively growing a silicon-based insulating film on the insulating film by repeating a plurality of times a first step of adsorbing an aminosilane-based gas onto the insulating film and the second conductive film and a second step of supplying a reaction gas for reacting with the adsorbed aminosilane-based gas to form the silicon-based insulating film, wherein the second conductive film is vaporized by reaction with the reaction gas so that the second conductive film is reduced in thickness; and selectively growing the second conductive film, wherein the selectively growing a silicon-based insulating film and the selectively growing the second conductive film are performed a predetermined number of times.

BRIEF DESCRIPTION OF DRAWINGS

The accompanying drawings, which are incorporated in and constitute a part of the specification, illustrate embodi- FIG. 1 is a flowchart illustrating an example of a selective growth method according to a first embodiment of the present disclosure.

FIG. 4 is a timing chart used when performing step S2 in the first embodiment.

FIG. 5 is a flowchart illustrating another example of the selective growth method according to the first embodiment.

FIG. 6 is a flowchart illustrating an example of a selective growth method according to a second embodiment of the present disclosure.

FIG. 10 is a flowchart illustrating an example of a selective growth method according to a third embodiment of the present disclosure.

FIG. 13 is a flowchart illustrating another example of the selective growth method according to the third embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

First, a first embodiment of the present disclosure will be described. FIG. 1 is a flowchart illustrating an example of a selective growth method according to the first embodiment of the present disclosure. FIGS. 2A to 2F are cross-sectional views schematically illustrating states when respective steps of the selective growth method illustrated in FIG. 1 are performed.

Figure 2A:
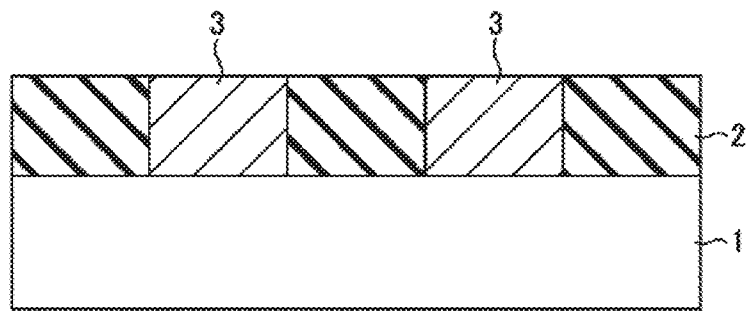
FIG. 2A is a cross-sectional view schematically illustrating a state when each step of the selective growth method illustrated in FIG. 1 is performed.

First of all, as illustrated in FIG. 2A, a structure having a pattern in which an insulating film 2 and a conductive film 3 alternately appear on a semiconductor wafer that is a semiconductor substrate as a workpiece, for example, a silicon wafer 1 (hereinafter, referred to as a wafer) is prepared (step S1). This structure represents a structure in the course of manufacturing a semiconductor integrated circuit device, in which exposed surfaces of the insulating film 2 and the conductive film 3 are target surfaces of the wafer 1 and are underlayers on which a thin film is selectively grown.

The insulating film 2 is a silicon oxide film (SiO$_2$ film). The conductive film 3 is made of a material whose at least surface portion is vaporized (sublimated) by oxidation (combustion), and is, for example, a ruthenium film (Ru film) or a carbon film (C film). The conductive film 3 may be made of only a material which is vaporized by oxidation, such as the Ru film or the C film. A material which is vaporized by oxidation may be formed on an underlying material.

Furthermore, in FIG. 2A, the exposed surfaces of the insulating film 2 and the conductive film 3 have the same height, but the height of the conductive film 3 may be higher than that of the insulating film 2.

Figure 2B:
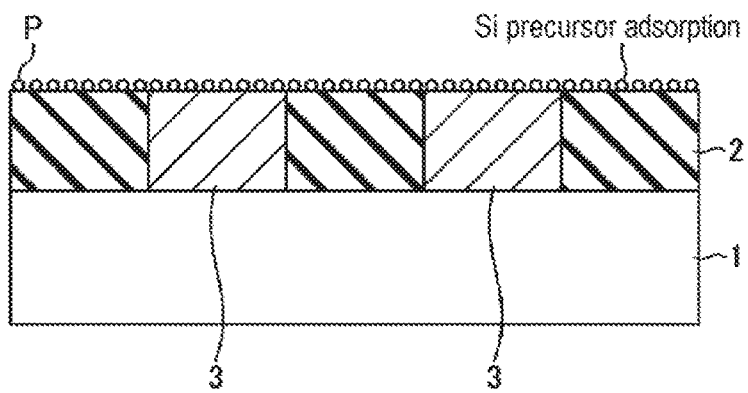
FIG. 2B is a cross-sectional view schematically illustrating a state when each step of the selective growth method illustrated in FIG. 1 is performed.
Figure 2C:
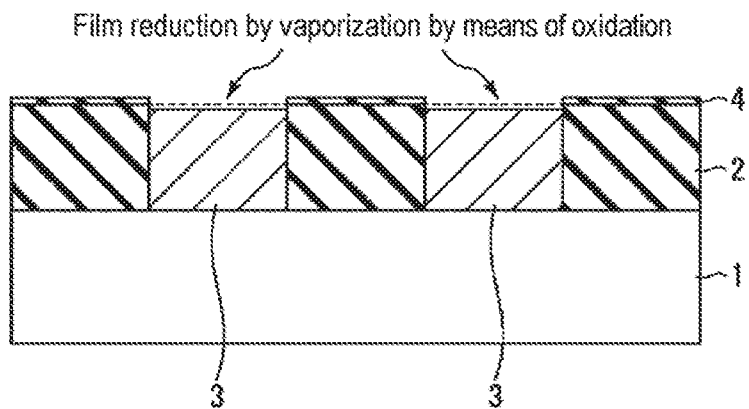
FIG. 2C is a cross-sectional view schematically illustrating a state when each step of the selective growth method illustrated in FIG. 1 is performed.

Subsequently, the supply of an Si precursor (sub-step S2a) and the supply of an oxidizing agent (sub-step S2b) are alternately repeated a plurality of times (step S2). When supplying the Si precursor at sub-step S2a, as illustrated in FIG. 2B, the Si precursor P is adsorbed onto the entire exposed surfaces of the insulating film 2 and the conductive film 3. On the other hand, when supplying the oxidizing agent at sub-step S2b, as illustrated in FIG. 2C, the adsorbed Si precursor is oxidized on the insulating film 2 formed of an SiO$_2$ film by the oxidizing agent to form a thin SiO$_2$ monomolecular film 4. In this case, a surface material, for example, Ru or C, is oxidized on the conductive film 3 by the oxidizing agent and then is vaporized (sublimated) so that the thin SiO$_2$ monomolecular film 4 is reduced in film thickness. At this time, the Si precursor adsorbed onto the conductive film 3 is also desorbed.

Figure 2D:
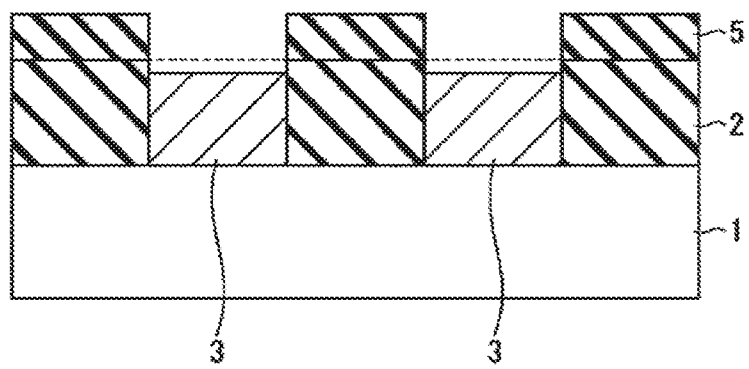
FIG. 2D is a cross-sectional view schematically illustrating a state when each step of the selective growth method illustrated in FIG. 1 is performed.

Therefore, by performing step S2 by repeating sub-step S2a and sub-step S2b a predetermined number of times, an insulating film 5 formed of an SiO$_2$ film and having a predetermined thickness is grown on the SiO$_2$ film constituting the insulating film 2 by an atomic layer deposition (ALD) method, and the conductive film 3 is reduced in thickness, as illustrated in FIG. 2D.

Figure 2E:
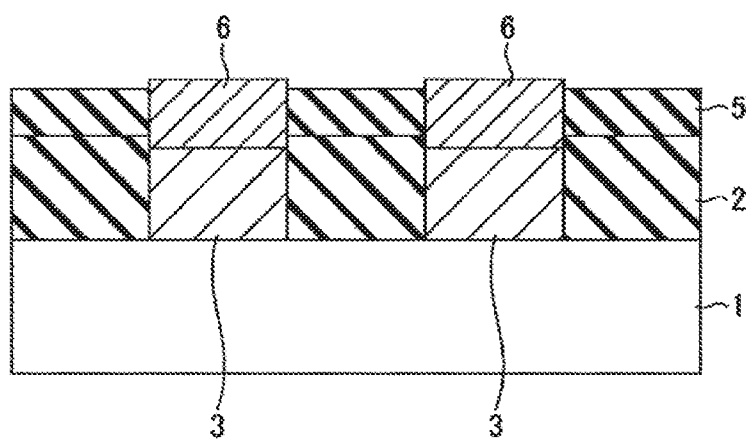
FIG. 2E is a cross-sectional view schematically illustrating a state when each step of the selective growth method illustrated in FIG. 1 is performed.

Subsequently, a precursor containing the same material as that of the surface portion of the conductive film 3 is supplied to selectively grow, only on the conductive film 3, a conductive film 6 which is vaporized by oxidation similar to that of the conductive film 3 (step S3), as illustrated in FIG. 2E. That is to say, a conductive material such as Ru or C is selectively grown only on the conductive film 3 because its incubation time on SiO$_2$ is very long so that hardly any film is formed thereon. At this time, the conductive film 6 grows substantially vertically while being guided by the insulating film 5.

Step S2 and step S3 described above are performed a predetermined number of times and end when a predetermined film thickness is obtained.

Figure 2F:
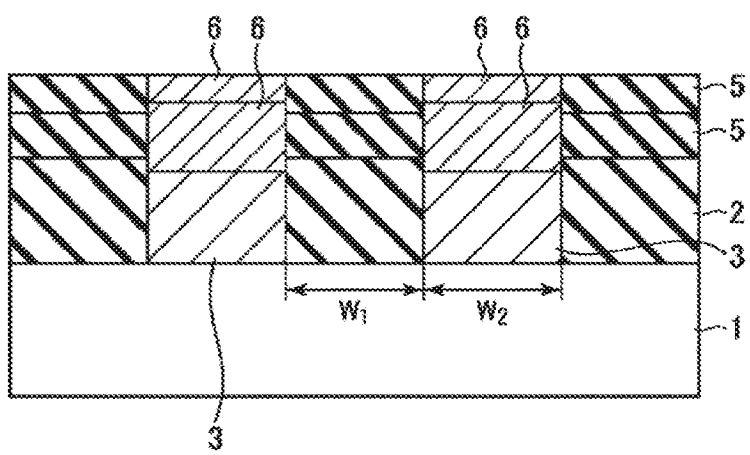
FIG. 2F is a cross-sectional view schematically illustrating a state when each step of the selective growth method illustrated in FIG. 1 is performed.

Thus, as illustrated in FIG. 2F, the insulating film 5 self-aligned with the pattern of the insulating film 2 and the conductive film 6 self-aligned with the pattern of the conductive film 3 can be obtained. In this case, when selectively growing the insulating film 5 formed of an SiO$_2$ film, the insulating film 5 is formed on the insulating film 2 by ALD and the conductive film 3 is vaporized by oxidization and is reduced in thickness. Thus, the insulating film 5 can be effectively and selectively grown.

In addition, the insulating film 5 formed of an SiO$_2$ film and the conductive film 6 formed of a Ru film or C film are selectively grown, which eliminates a need for a lithography process. Therefore, the present disclosure can be applied even in a case where both a width $W_1$ of the insulating film 2 and a width $W_2$ of the conductive film 3 are reduced beyond a resolution limit of lithography.

Figure 3A:
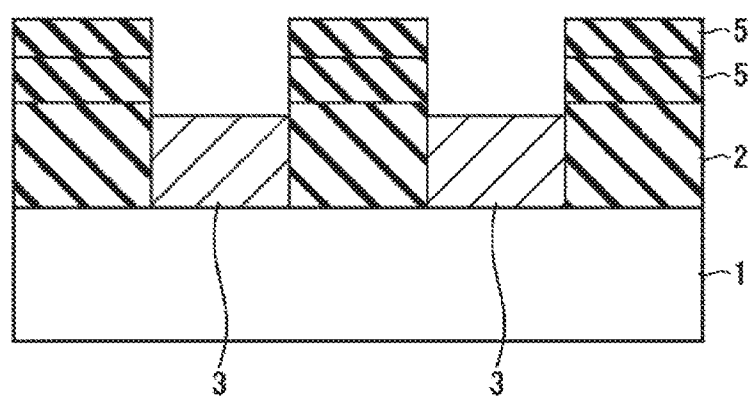
FIG. 3A is a cross-sectional view illustrating a state in which a conductive film is removed from the state of FIG. 2F.
Figure 3B:
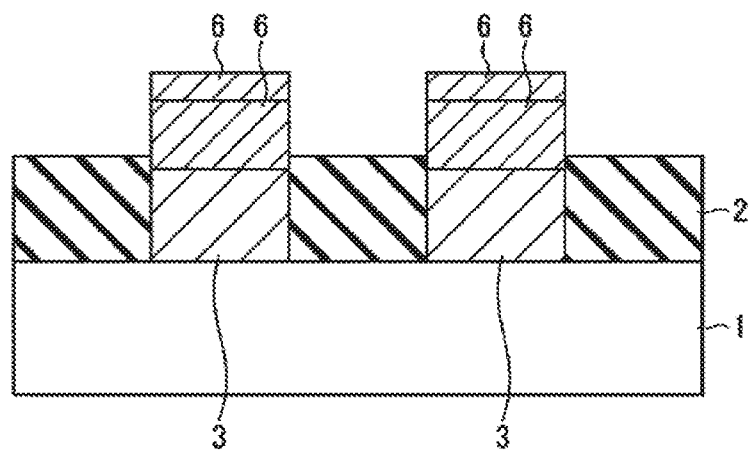
FIG. 3B is a cross-sectional view illustrating a state in which an insulating film is removed from the state of FIG. 2F.

As described above, after the insulating film 5 and the conductive film 6 having a predetermined film thickness are formed, as illustrated in FIGS. 3A and 3B, the conductive film 6 or the insulating film 5 may be removed to leave a necessary film serving as connection alignment of upper layer wirings. At this time, a portion or all of the insulating film 2 together with the insulating film 5 may also be removed, or a portion or all of the conductive film 3 together with the conductive film 6 may also be removed. When the conductive film 6 is a C film, the conductive film 6 may be easily removed by using the oxidizing agent for forming the insulating film 5.

The processing apparatus is not particularly limited. For example, various apparatuses such as a vertical batch-type film forming apparatus capable of processing a plurality of, e.g., 50 to 100 workpieces in a stacked state, a single-wafer-type processing apparatus capable of processing workpieces one by one, and the like may be used.

Next, step S2 mentioned above will be described in detail.

An aminosilane-based gas is used as the Si precursor used at sub-step S2a of step S2 mentioned above. As the aminosilane-based gas, it may be possible to use a gas whose ligand molecular weight is relatively large, or a gas that has two or more hydrocarbon groups existing in one molecule. Furthermore, in the case where the hydrocarbon group is a methyl group having a small molecular weight, it may be possible to use a gas that has four or more methyl groups existing in one molecule. When aminosilane having such a relatively large ligand molecular weight adheres to the conductive film 3 and subsequently the oxidizing agent is supplied to the aminosilane, the oxidizing agent easily reaches the conductive film 3, thus making it possible to oxidize the conductive film 3 almost without causing the generation of SiO$_2$ by the oxidizing agent.

Appropriate examples of the aminosilane-based gas may include tris-dimethylaminosilane (3DMAS), tetrakis-dimethylaminosilane (4DMAS), trimethylsilane dimethylamine (TMSDMA), and the like.

As the hydrocarbon group of the aminosilane-based gas, it may be possible to use ones containing, for example, an alkyl group, a vinyl group, an ethynyl group, a phenyl group or the like, derived from alkane, alkene, alkyne, cycloalkane, cycloalkene, or cycloalkyne.

The oxidizing agent used at sub-step S2b of step S2 mentioned above may include an ozone (O$_3$) gas, an O$_2$ gas, an O$_2$/H$_2$ mixed gas, an H$_2$O gas, and the like.

When performing step S2, a workpiece having a structure in which the insulating film 2 and the conductive film 3 are formed on the wafer 1 is held inside a process vessel. As illustrated in FIG. 4, the aminosilane-based gas as the Si precursor and the oxidizing agent are alternately supplied, while performing a process of removing an excess gas such as an adsorption gas adsorbed onto the workpiece, such as purging the interior of the process vessel. As the purge gas, it may be possible to use an inert gas such as an N$_2$ gas or an Ar gas.

Examples of the processing conditions of step S2 in the case where the vertical batch-type processing apparatus is used may be as follows:

Processing temperature: 200 degrees C.
Si precursor: 3DMAS
Oxidizing agent: O$_3$ gas
Supply conditions of Si precursor:
Flow rate of 3DMAS gas: 50 to 300 sccm
Supply time period: 5 to 30 sec
Processing pressure: 0.1 to 4 Torr (13.3 to 533 Pa)
Oxidizing conditions:
Flow rate of O$_3$ gas: 6.5 sLm
Supply time period: 60 to 600 sec Processing pressure: 0.5 Torr (66.7 Pa).

Next, step S3 will be described in detail.

One containing a material constituting at least the surface of the conductive film 3 may be used as the precursor used at step S3. The conductive film 6 made of the same material as that of at least the surface of the conductive film 3 is formed on the surface of the conductive film 3. For example, in the case where at least the surface of the conductive film 3 is an Ru film, it is possible to form the conductive film 6 by a chemical vapor deposition (CVD) method, specifically a thermal CVD, for example, using ruthenium carbonyl ($Ru_3(CO)_{12}$), as a ruthenium precursor for forming the conductive film 6. As the ruthenium precursor, it may also be possible to use other organic ruthenium compounds such as a cyclopentadienyl group.

Examples of the processing conditions of step S3 in the case where the vertical batch-type processing apparatus is used and the conductive film 6 is an Ru film may be as follows:

Processing temperature: 200 degrees C.
Ruthenium precursor: $Ru_3(CO)_{12}$
Flow rate of $Ru_3(CO)_{12}$ gas: 10 sccm
Processing time period: 900 sec
Processing pressure: 0.1 Torr (13.3 Pa).

In the case where at least the surface of the conductive film 3 is a carbon film, as described in the related art, a hydrocarbon gas such as butadiene ($C_4H_6$) may be used as a carbon precursor for forming the conductive film 6. A halogen-containing gas, for example, a halogen gas such as a chlorine gas ($Cl_2$ gas) or a halogenated hydrocarbon gas may be used as a reaction gas. The hydrocarbon gas may include $C_2H_2$ or $C_5CH_8$, in addition to $C_4H_6$. As the halogen gas, it may be possible to use, in addition to the $Cl_2$ gas, an iodine gas ($I_2$ gas).

Examples of the processing conditions of step S3 in the case where the vertical batch-type processing apparatus is used and the conductive film 6 is a carbon film may be as follows:

Processing temperature: 350 degrees C.
Carbon precursor: $C_4H_6$
Reaction gas: $Cl_2$ gas
Flow rate of $C_4H_6$ gas: 200 sccm
Flow rate of $Cl_2$ gas: 50 sccm
Processing time period: 180 min
Processing pressure: 6 Torr (798 Pa).

In addition, the number of executions of step S2 and step S3 is not particularly limited, and the final step is not limited as well. That is to say, the process may be ended at step S2 or at step S3. Furthermore, in the case of leaving the insulating film 5, as illustrated in FIG. 5, step S2 may be performed once and step S3 may be omitted. In the case of leaving the conductive film 6, the process may be ended at step S3 without repeating steps S2 and S3.

Second Embodiment

Next, a second embodiment of the present disclosure will be described. FIG. 6 is a flowchart illustrating an example of a selective growth method according to the second embodiment of the present disclosure. FIGS. 7A to 7G are cross-sectional views schematically illustrating states when respective steps of the selective growth method illustrated in FIG. 6 are performed.

Figure 7A:
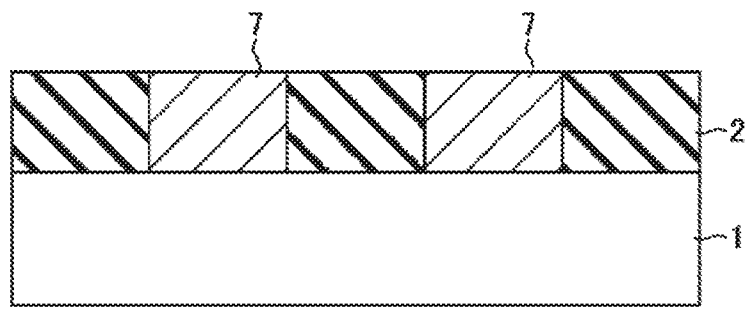
FIG. 7A is a cross-sectional view schematically illustrating a state when each step of the selective growth method illustrated in FIG. 6 is performed.

First, as illustrated in FIG. 7A, a structure in which an insulating film 2 and a metal film 7 as a conductive film are alternately formed on a wafer 1 as a workpiece is prepared (step S11). This structure represents a structure in the course of manufacturing a semiconductor integrated circuit device, in which exposed surfaces of the insulating film 2 and the metal film 7 are target surfaces of the wafer 1, and are underlayers on which a thin film is selectively grown.

As in the first embodiment, the insulating film 2 is a silicon oxide film ($SiO_2$ film). Meanwhile, for example, tungsten (W) is used as the metal film 7.

Figure 7B:
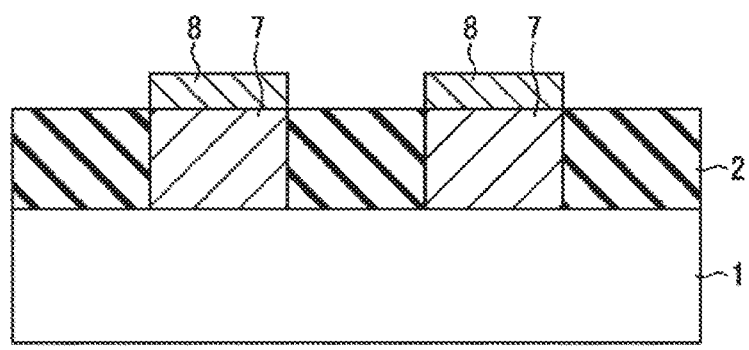
FIG. 7B is a cross-sectional view schematically illustrating a state when each step of the selective growth method illustrated in FIG. 6 is performed.

Subsequently, as illustrated in FIG. 7B, a conductive film 8, for example, an Ru film or a C film, which is vaporized (sublimated) by oxidation (combustion), is selectively grown on the metal film 7 (step S12). This process is similar to a step disclosed in the related art.

Thus, a film formation reaction of the conductive film 8 is promoted on the surface of the metal film 7 by a catalytic action of the metal film 7 to form a C film as the conductive film 8, for example, by the formulas mentioned in the related art. On the other hand, as disclosed in the related art, the incubation time of the film formation reaction becomes extremely long on the $SiO_2$ film as the insulating film 2 so that the conductive film 8 selectively grows on the metal film 7.

The metal constituting the metal film 7 may include vanadium (V), chromium (Cr), manganese (Mn), iron (Fe), cobalt (Co), nickel (Ni), zinc (Zn), gallium (Ga), germanium (Ge), silicon (Si), zirconium (Zr), niobium (Nb), molybdenum (Mo), technetium (Tc), hafnium (Hf), rhodium (Rh), palladium (Pd), indium (Pd), tin (Sn), tantalum (Ta), rhenium (Re), osmium (Os), iridium (Ir), platinum (Pt), gold (Au), and the like, in addition to W.

At step S12, the Ru film or the C film may be formed under the same conditions as those of step S3 of the first embodiment.

Figure 7C:
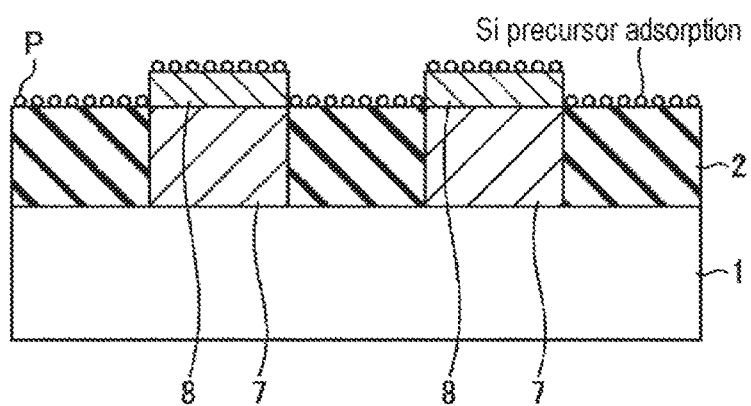
FIG. 7C is a cross-sectional view schematically illustrating a state in which each step of the selective growth method illustrated in FIG. 6 is performed.
Figure 7D:
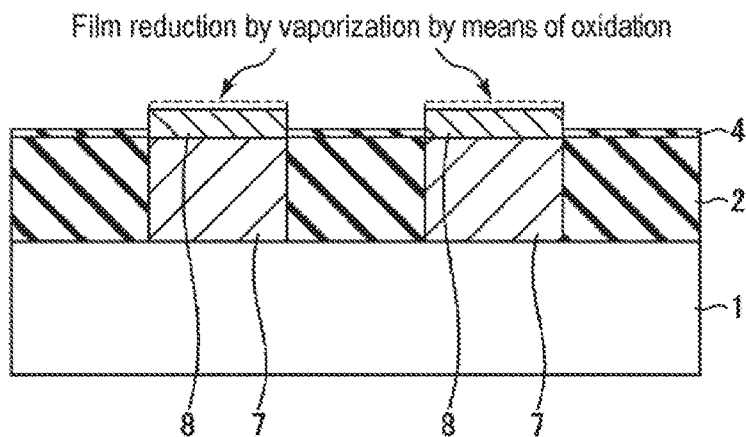
FIG. 7D is a cross-sectional view schematically illustrating a state when each step of the selective growth method illustrated in FIG. 6 is performed.

Subsequently, the supply of a Si precursor (sub-step S13a) and the supply of an oxidizing agent (sub-step S13b) are alternately repeated a plurality of times (step S13). This is similar to step S2 of the first embodiment. When supplying the Si precursor at sub-step S3a, as illustrated in FIG. 7C, the Si precursor is adsorbed onto the entire exposed surfaces of the insulating film 2 and the conductive film 8. On the other hand, when supplying the oxidizing agent at sub-step S13b, as illustrated in FIG. 7D, the adsorbed Si precursor is oxidized on the insulating film 2 formed of an $SiO_2$ film by the oxidizing agent to form a thin $SiO_2$ monomolecular film 4. Meanwhile, a surface material of the conductive film 8, for example, Ru or C is oxidized on the conductive film 8 by the oxidizing agent and is sublimated (vaporized) so that the conductive film 8 is reduced in thickness. At that time, the Si precursor adsorbed onto the conductive film 8 is also desorbed.

Figure 7E:
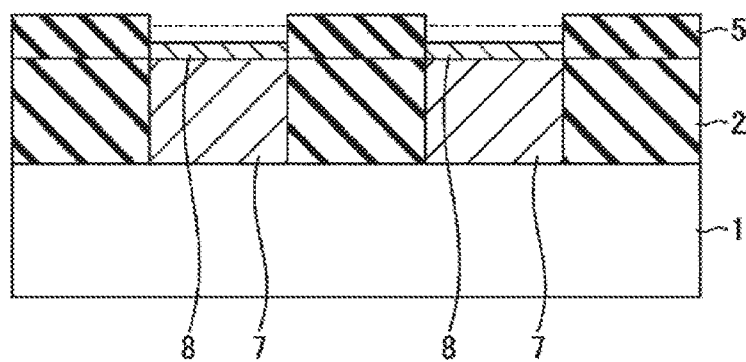
FIG. 7E is a cross-sectional view schematically illustrating a state when each step of the selective growth method illustrated in FIG. 6 is performed.

Therefore, by performing step S13 through the repetition of sub-step S13a and sub-step S13b a predetermined number of times, whereby an insulating film 5 formed of an $SiO_2$ film and having a predetermined thickness is formed and grows on the $SiO_2$ film constituting the insulating film 2 by ALD, and the conductive film 8 is reduced in thickness, as illustrated in FIG. 7E.

Examples of the Si precursor, the oxidizing agent, and the processing conditions applied at step S13, and the like are similar to those of step S2 of the first embodiment.

Figure 7F:
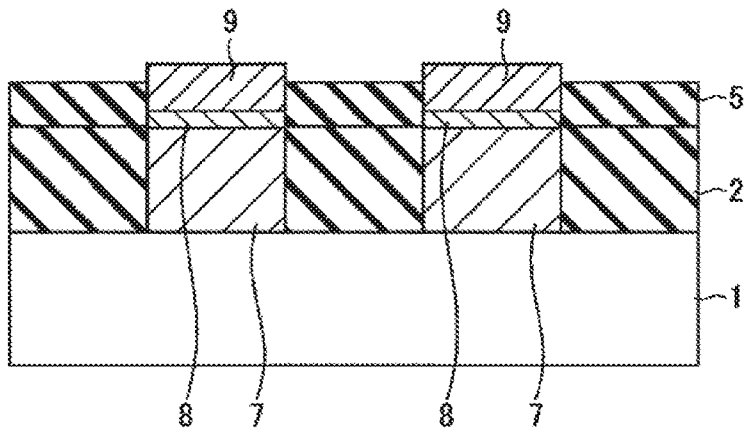
FIG. 7F is a cross-sectional view schematically illustrating a state when each step of the selective growth method illustrated in FIG. 6 is performed.

Subsequently, a precursor containing the same material as that of the surface portion of the conductive film 8 is supplied to selectively grow a conductive film 9 which is vaporized by oxidation similar to that of the conductive film 8 only on the conductive film 8 as illustrated in FIG. 7F (step S14). This step is performed in the same manner as that of step 3 of the first embodiment.

After performing step S12 described above, step S13 and step S14 are performed a predetermined number of times, and the process ends when a predetermined film thickness is obtained.

Figure 7G:
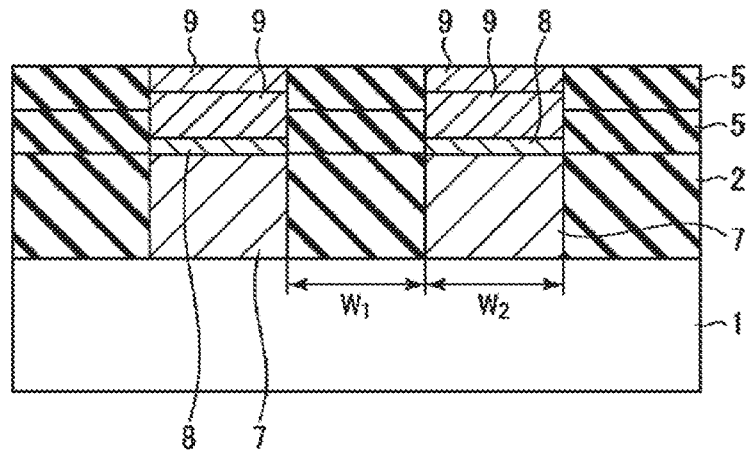
FIG. 7G is a cross-sectional view schematically illustrating a state when each step of the selective growth method illustrated in FIG. 6 is performed.

Thus, as illustrated in FIG. 7G, the insulating film 5 self-aligned with the pattern of the insulating film 2, and the conductive film 8 and the conductive film 9 self-aligned with the pattern of the metal film 7 can be obtained. In this case, when selectively growing the insulating film 5 formed of an $SiO_2$ film, the insulating film 5 is formed on the insulating film 2 by ALD. The conductive film 8 is vaporized by oxidation so that the conductive film 8 is reduced in thickness. It is therefore possible to effectively and selectively grow the insulating film 5.

Even in this embodiment, the insulating film 5 formed of an $SiO_2$ film and the conductive film 9 formed of a Ru film or C film are selectively grown, which eliminates a need for a lithography process. Therefore, the present disclosure may be applied even in the case where both the width $W_1$ of the insulating film 2 and the width $W_2$ of the metal film 7 are reduced beyond a resolution limit of lithography.

Figure 8A:
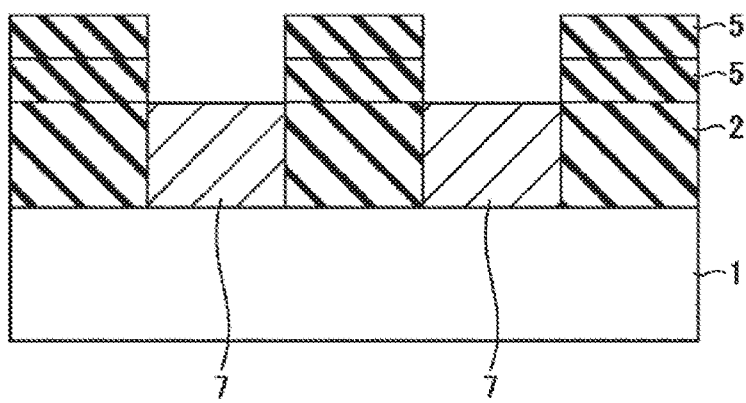
FIG. 8A is a cross-sectional view illustrating a state in which conductive films are removed from the state of FIG. 3G.
Figure 8B:
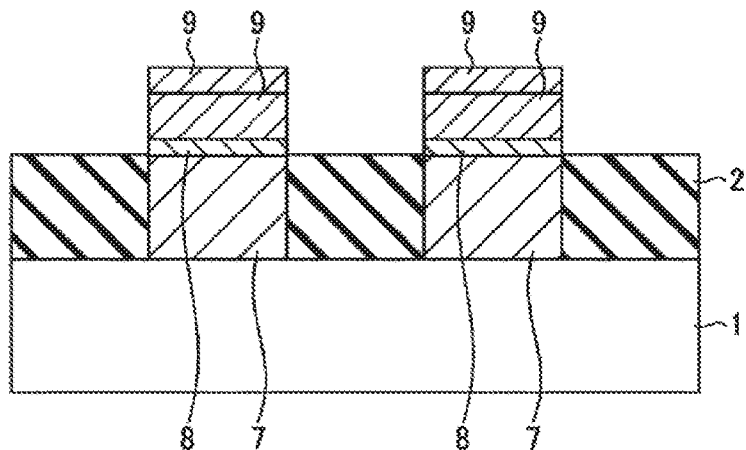
FIG. 8B is a cross-sectional view illustrating a state in which an insulating film is removed from the state of FIG. 3G.

Even in this embodiment, after the insulating film 5 and the conductive film 9 having a predetermined film thickness are formed, as illustrated in FIGS. 8A and 8B, the conductive films 8 and 9 or the insulating film 5 may be removed to leave a necessary film serving as connection alignment of upper layer wirings. At this time, a portion or all of the insulating film 2 together with the insulating film 5 may also be removed, or a portion or all of the metal film 7 together with the conductive films 8 and 9 may also be removed. When the conductive films 8 and 9 are C films, they may be easily removed by using the oxidizing agent for forming the insulating film 5.

Figure 9:
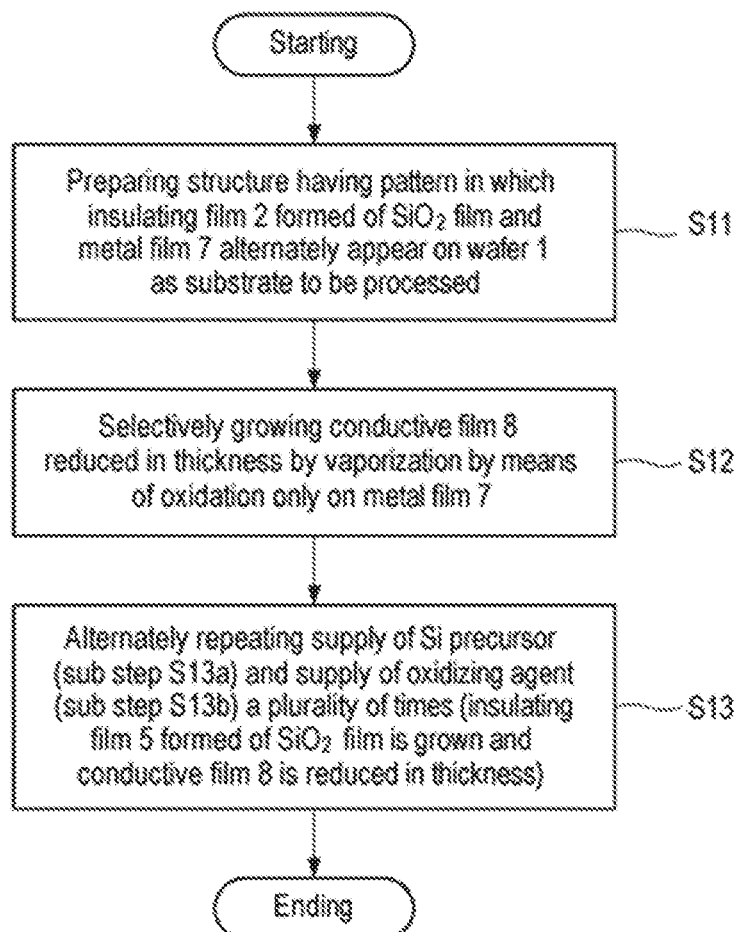
FIG. 9 is a flowchart illustrating another example of the selective growth method according to the second embodiment.

In addition, the number of executions of step S13 and step S14 is not particularly limited, and the final step is not limited as well. That is to say, the process may end at step S13 or step S14. In the case of leaving the insulating film 5, as illustrated in FIG. 9, step S12 and step S13 may be performed once and step S14 may be omitted.

Depending on a material of the underlying metal film 7, there may be a case where it may be difficult for a reaction to occur between the hydrocarbon gas and the halogen-containing gas at a low temperature when the C film is formed as the conductive film 8. In such a case, a metal film made of another metal on which such a reaction is likely to occur, may be formed on the metal film 7. In this case, the method disclosed in the related art may be used.

Third Embodiment

Next, a third embodiment of the present disclosure will be described. In this embodiment, a case where a silicon nitride film (SiN film) is applied as the insulating film will be described. FIG. 10 is a flowchart illustrating an example of a selective growth method according to the third embodiment of the present disclosure. FIGS. 11A to 11F are cross-sectional views schematically illustrating states when respective steps of the selective growth method illustrated in FIG. 10 are performed.

Figure 11A:
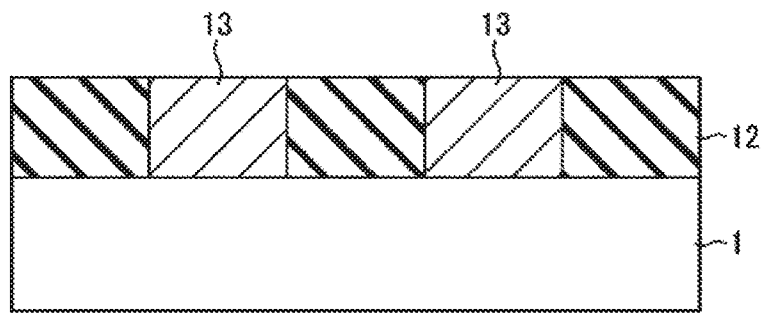
FIG. 11A is a cross-sectional view schematically illustrating a state when each step of the selective growth method illustrated in FIG. 10 is performed.

First, as illustrated in FIG. 11A, a structure having a pattern in which an insulating film 12 and a conductive film 13 alternately appear on a semiconductor wafer that is a semiconductor substrate as a workpiece, for example, a silicon wafer 1 (hereinafter, referred to as a wafer) is prepared (step S21). This structure represents a structure in the course of manufacturing a semiconductor integrated circuit device, in which exposed surfaces of the insulating film 12 and the conductive film 13 are target surfaces of the wafer 1, and are underlayers on which a thin film is selectively grown.

The insulating film 12 is a silicon nitride film (SiN film), and the conductive film 13 is a film made of a material whose at least surface portion is vaporized by nitridation, for example, a germanium film (Ge film). The conductive film 13 may be made of only a material which is vaporized by nitridation, such as the Ge film. A material which is vaporized by nitridation may be formed on the underlying material.

Furthermore, in FIG. 11A, the exposed surfaces of the insulating film 12 and the conductive film 13 have the same height, but the height of the conductive film 13 may be higher than that of the insulating film 12.

Figure 11B:
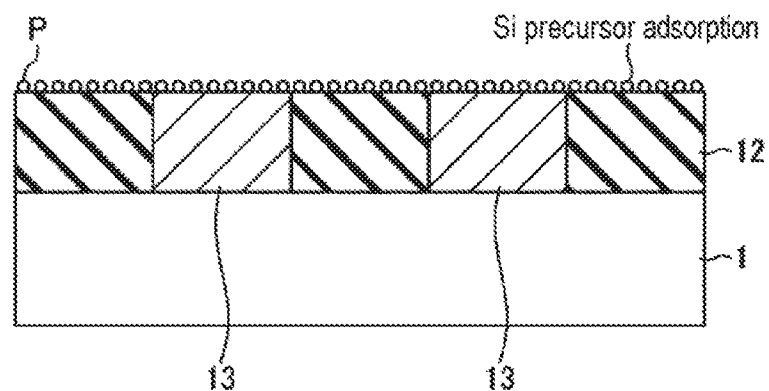
FIG. 11B is a cross-sectional view schematically illustrating a state when each step of the selective growth method illustrated in FIG. 10 is performed.
Figure 11C:
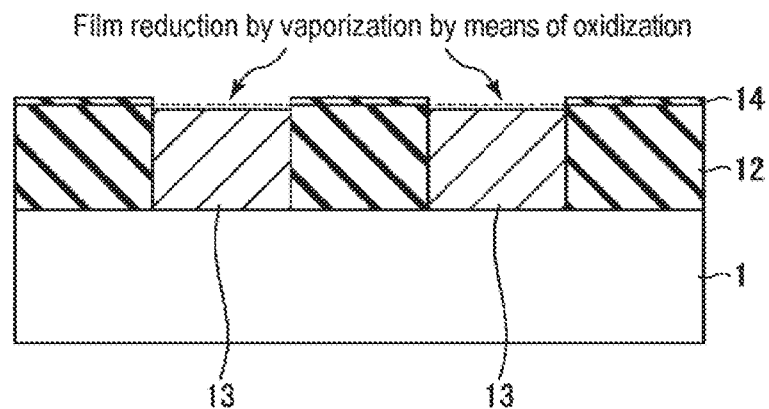
FIG. 11C is a cross-sectional view schematically illustrating a state when each step of the selective growth method illustrated in FIG. 10 is performed.

Subsequently, the supply of an Si precursor (sub-step S22a) and the supply of a nitriding agent (sub-step S22b) are alternately repeated a plurality of times (step S22). When supplying the Si precursor at sub-step S22a, as illustrated in FIG. 11B, the Si precursor P is adsorbed onto the entire exposed surfaces of the insulating film 12 and the conductive film 13. On the other hand, when supplying the nitriding agent at sub-step S22b, as illustrated in FIG. 11C, the adsorbed Si precursor is nitrided on the insulating film 12 formed of an SiN film by the nitriding agent to form a thin SiN monomolecular film 14. Meanwhile, a surface material of the conductive film 13, for example, Ge, is nitrided on the conductive film 13 by the nitriding agent and is vaporized (sublimated) so that the conductive film 13 is reduced in thickness. At this time, the Si precursor adsorbed onto the conductive film 13 is also desorbed.

Figure 11D:
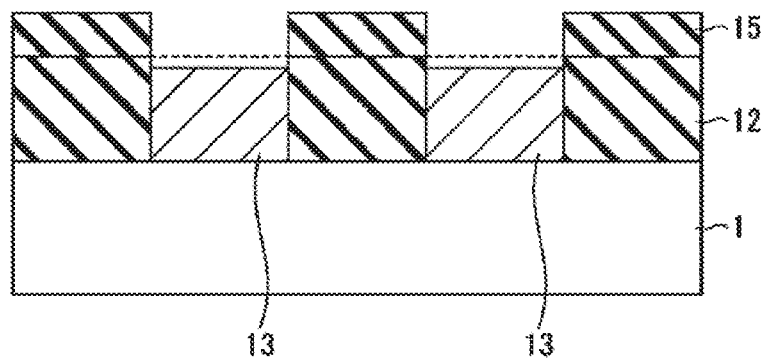
FIG. 11D is a cross-sectional view schematically illustrating a state when each step of the selective growth method illustrated in FIG. 10 is performed.

Therefore, by performing step S22 through the repetition of sub-step S22a and sub-step S22b a predetermined number of times, an insulating film 15 formed of an SiN film and having a predetermined thickness grows on the SiN film constituting the insulating film 12 by ALD, and the conductive film 13 is reduced in thickness, as illustrated in FIG. 11D.

Figure 11E:
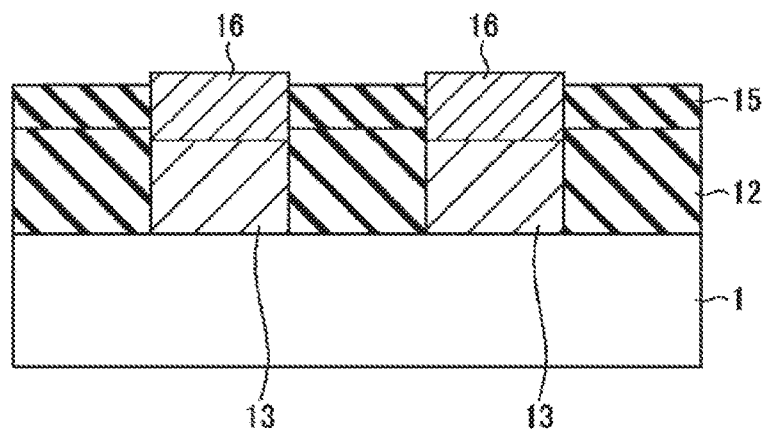
FIG. 11E is a cross-sectional view schematically illustrating a state when each step of the selective growth method illustrated in FIG. 10 is performed.

Subsequently, a precursor containing the same material as that of the surface portion of the conductive film 13 is supplied, and a conductive film 16 which is vaporized by nitridation similar to that of the conductive film 13 is selectively grown only on the conductive film 13 (step S23), as illustrated in FIG. 11E. That is to say, the metal such as Ge selectively grows only on the conductive film 13 because its incubation time is very long on $SiO_2$ to hardly form a film thereon. At this time, the conductive film 16 substantially vertically grows while being guided by the insulating film 15.

Steps S22 and S23 described above are performed a predetermined number of times, and the process ends when a predetermined film thickness is obtained.

Figure 11F:
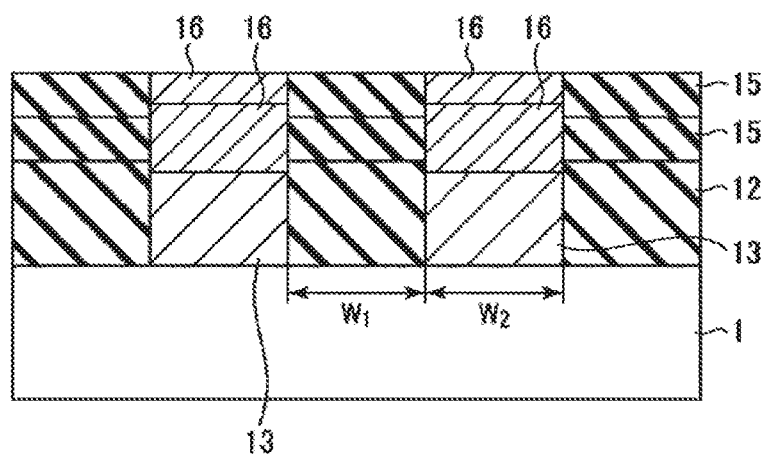
FIG. 11F is a cross-sectional view schematically illustrating a state when each step of the selective growth method illustrated in FIG. 10 is performed.

Thus, as illustrated in FIG. 11F, the insulating film 15 self-aligned with the pattern of the insulating film 12 and the conductive film 16 self-aligned with the pattern of the conductive film 13 can be obtained. In this case, when selectively growing the insulating film 15 formed of an SiN film, the insulating film 15 is formed on the insulating film 12 by ALD, and the conductive film 13 is vaporized by nitridation so that the conductive film 13 is reduced in thickness. Thus, the insulating film 15 can be effectively and selectively grown.

In addition, the insulating film 15 formed of an SiN film and the conductive film 16 formed of a Ge film are selectively grown, which eliminates a need for a lithography process. Therefore, the present disclosure may be applied even in the case where both the width $W_1$ of the insulating film 12 and the width W₂ of the conductive film 13 are reduced beyond a resolution limit of lithography.

Figure 12A:
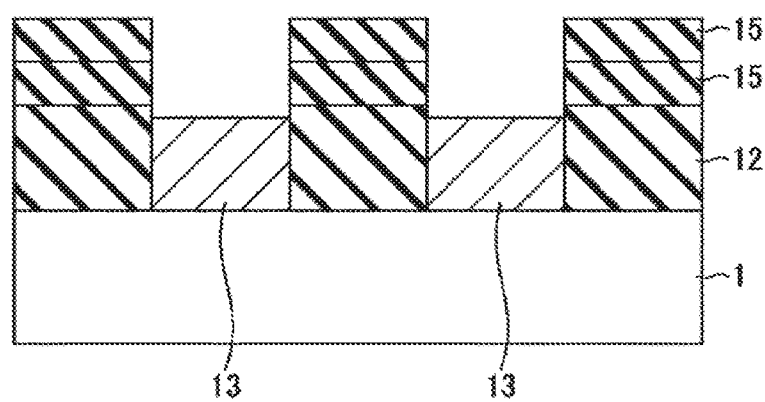
FIG. 12A is a cross-sectional view illustrating a state in which a conductive film is removed from the state of FIG. 11F.
Figure 12B:
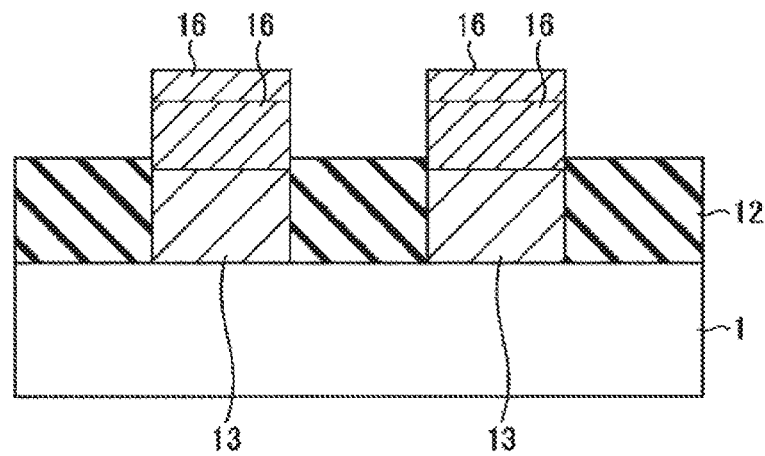
FIG. 12B is a cross-sectional view illustrating a state in which an insulating film is removed from the state of FIG. 11F.

As described above, after the insulating film 15 and the conductive film 16 having a predetermined film thickness are formed, as illustrated in FIGS. 12A and 12B, the conductive film 16 or the insulating film 15 may be removed to leave a necessary film serving as connection alignment of upper layer wirings. At this time, a portion or all of the insulating film 12 together with the insulating film 15 may be removed, or a portion or all the conductive film 13 together with the conductive film 16 may be removed.

Even in this embodiment, the processing apparatus is not particularly limited. For example, various apparatuses such as a vertical batch-type film forming apparatus, a single-wafer-type processing apparatus capable of processing target substrates one by one may be used.

Next, step S22 mentioned above will be described in detail.

An aminosilane-based gas is used as the Si precursor used at sub-step S22a of step S22, as in the first embodiment. Examples of the aminosilane-based gas may be a gas whose ligand molecular weight is relatively large, and a gas whose the number of hydrocarbon groups existing in one molecule is two or more. Furthermore, in the case where the hydrocarbon group is a methyl group having a small molecular weight, it may be possible to use a gas whose the number of methyl groups existing in one molecule is four or more. When aminosilane having such a relatively large ligand molecular weight adheres to the conductive film 13 and subsequently the nitriding agent is supplied, the nitriding agent easily reaches the conductive film 13, which makes it possible to oxidize the conductive film 3 substantially without causing the generation of SiN by the nitriding agent.

As an example of the aminosilane-based gas, it may be possible to use the same one as in the first embodiment. As the hydrocarbon group of the aminosilane-based gas, it may be possible to use the same one as in the first embodiment.

The nitriding agent used at sub-step S22b of step S22 described above may include ammonia ($NH_3$), a hydrazine-based gas, a hydrogen gas, and the like.

When performing step S22, a workpiece having a structure in which the insulating film 12 and the conductive film 13 are formed on the wafer 1 is held inside the process vessel. The aminosilane-based gas as an Si precursor and the nitriding agent are alternately supplied into the process vessel, while performing a process of removing an excess gas such as an adsorption gas of the workpiece, such as purging the interior of the process vessel, as in FIG. 4 of the first embodiment. As the purge gas, it may be possible to use an inert gas such as an $N_2$ gas or an Ar gas.

Examples of the processing conditions of step S22 in the case where the vertical batch-type processing apparatus is used may be as follows:
Processing temperature: 300 degrees C.
Si precursor: 3DMAS
Nitriding agent: $NH_3$ gas
Si precursor supply conditions:
Flow rate of 3DMAS gas: 50 to 300 sccm
Supply time period: 1 to 60 sec
Processing pressure: 0.1 to 5 Torr (13.3 to 667 Pa)
Nitriding conditions:
Flow rate of $NH_3$ gas: 5 sLm
Supply time period: 5 to 60 sec
Processing pressure: 0.3 Torr (39.9 Pa).

Next, step S23 will be described in detail.

As the precursor used at step S23 described above, the one containing a material constituting at least the surface of the conductive film 13 may be used. A conductive film 16 made of the same material as that of at least the surface of the conductive film 13 is formed on the surface of the conductive film 13. For example, in the case where at least the surface of the conductive film 13 is a Ge film, it is possible to form the conductive film 16 by using a germane-based compound such as, e.g., monogermane ($GeH_4$) or the like as the germanium precursor used when forming the conductive film 16 through a chemical vapor deposition (CVD) method, specifically a thermal CVD method.

Examples of the processing conditions of step S23 in the case where the vertical batch-type processing apparatus is used and the conductive film 16 is a Ge film may be as follows:
Processing temperature: 300 degrees C.
Germanium precursor: $GeH_4$
Flow rate of $GeH_4$ gas: 100 sccm
Processing time: 900 sec
Processing pressure: 1 Torr (133 Pa).

In addition, the number of executions of step S22 and step S23 is not particularly limited, and the final step is not limited as well. That is to say, the process may end at step S22 or step S23. In the case of leaving the insulating film 15, as illustrated in FIG. 13, step S22 may be performed once and step S23 may be omitted. Furthermore, in the case of leaving the conductive film 16, the process may end at step S23 without repeating steps S22 and S23.

As in the second embodiment, after forming the conductive film which is vaporized by nitridation on the underlying metal film, the selective growth of the SiN film and the selective growth of the conductive film may be performed by the aforementioned procedure.

<Other Applications>

While the embodiments of the present disclosure have been described above, the present disclosure is not limited to the aforementioned embodiments but may be differently modified without departing from the spirit of the present disclosure.

For example, in the aforementioned embodiments, there has been described a case where the combination of the $SiO_2$ film as the insulating film and the material, which is vaporized by oxidation, such as an Ru film or a C film as the conductive film, and the combination of the SiN film as the insulating film and the material, which is vaporized by nitridation, such as a Ge film as the conductive film, are used. However, the present disclosure is not limited thereto. The present disclosure may be applied to a case where an Si-based insulating film is selectively grown on another Si-based insulating film by ALD with an aminosilane gas as a Si precursor and a reaction gas, and a material which is vaporized by reaction with the reaction gas and is reduced in thickness is used while an insulating film is grown as the conductive film.

According to the present disclosure in some embodiments, a first step of adsorbing an aminosilane-based gas onto an insulating film and a conductive film and a second step of supplying a reaction gas for reacting with the adsorbed aminosilane-based gas to form an Si-based insulating film are repeated a plurality of times to selectively grow the Si-based insulating film on the insulating film. At this time, the conductive film is vaporized by the reaction with the reaction gas so that the conductive film is reduced in thickness. Thus, even in a fine semiconductor device structure, it is possible to effectively and selectively grow the silicon-based insulating film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A selective growth method of selectively growing a thin film on an underlayer on which an insulating film and a conductive film are exposed, comprising:
    preparing a workpiece having the underlayer on which the insulating film and the conductive film are exposed; and
    selectively growing a silicon-based insulating film on the insulating film by repeating a cycle a plurality of times, the cycle including:
        a first step of adsorbing an aminosilane-based gas onto the insulating film and the conductive film; and
        a second step of supplying a reaction gas to the workpiece such that the silicon-based insulating film is formed on the insulating film by the reaction gas acting on the aminosilane-based gas adsorbed onto the insulating film, and the conductive film is vaporized and reduced in thickness by the reaction gas acting on the conductive film.

2. The method of claim 1, further comprising: removing the grown silicon-based insulating film or the grown conductive film.

3. The method of claim 1, wherein the aminosilane-based gas contains two or more hydrocarbon groups existing in one molecule.

4. The method of claim 3, wherein the aminosilane-based gas contains four or more methyl groups existing in one molecule when the hydrocarbon group is a methyl group.

5. The method of claim 1, wherein the silicon-based insulating film is a silicon oxide film, the reaction gas is an oxidizing agent, and the conductive film is made of a material which is oxidized by the oxidizing agent and is vaporized.

6. The method of claim 5, wherein the conductive film is a ruthenium film or a carbon film.

7. The method of claim 5, wherein the oxidizing agent is selected from an ozone gas, an $O_2$ gas, an $O_2/H_2$ mixed gas, and an $H_2O$ gas.

8. The method of claim 1, wherein the silicon-based insulating film is a silicon nitride film, the reaction gas is a nitriding agent, and the conductive film is made of a material which is nitrided by the nitriding agent and is vaporized.

9. The method of claim 8, wherein the conductive film is a germanium film.

10. The method of claim 8, wherein the nitriding agent is selected from an ammonia gas, a hydrazine-based gas, and a hydrogen gas.

11. A selective growth method of selectively growing a thin film on an underlayer on which an insulating film and a conductive film are exposed, comprising:
    preparing a workpiece having the underlayer on which the insulating film and the conductive film are exposed;
    selectively growing a silicon-based insulating film on the insulating film by repeating a cycle a plurality of times, the cycle including:
        a first step of adsorbing an aminosilane-based gas onto the insulating film and the conductive film; and
        a second step of supplying a reaction gas to form to the workpiece such that the silicon-based insulating film is formed on the insulating film by the reaction gas acting on the aminosilane-based gas adsorbed onto the insulating film, and the conductive film is vaporized and reduced in thickness by the reaction gas acting on the conductive film; and
    subsequently, selectively growing the conductive film,
    wherein the selectively growing a silicon-based insulating film and the selectively growing the conductive film are performed a predetermined number of times.

12. The method of claim 11, wherein the method is ended in either of the selectively growing a silicon-based insulating film and the selectively growing the conductive film.

13. A selective growth method of selectively growing a thin film on an underlayer on which an insulating film and a first conductive film are exposed, comprising:
    preparing a workpiece having the underlayer on which the insulating film and a metal film as the first conductive film are exposed;
    selectively growing a second conductive film on the metal film; and
    selectively growing a silicon-based insulating film on the insulating film by repeating a cycle a plurality of times, the cycle including:
        a first step of adsorbing an aminosilane-based gas onto the insulating film and the second conductive film; and
        a second step of supplying a reaction gas to the workpiece such that the silicon-based insulating film is formed on the insulating film by the reaction gas acting on the aminosilane-based gas adsorbed onto the insulating film, and the second conductive film is vaporized and reduced in thickness by reaction with the reaction gas acting on the second conductive film.

14. The method of claim 13, wherein the metal film is made of a material selected from a group consisting of tungsten (W), vanadium (V), chromium (Cr), manganese (Mn), iron (Fe), cobalt (Co), nickel (Ni), zinc (Zn), gallium (Ga), germanium (Ge), silicon (Si), zirconium (Zr), niobium (Nb), molybdenum (Mo), technetium (Tc), hafnium (Hf), rhodium (Rh), palladium (Pd), indium (In), tin (Sn), tantalum (Ta), rhenium (Re), osmium (Os), iridium (Ir), platinum (Pt), and gold (Au).

15. A selective growth method of selectively growing a thin film on an underlayer on which an insulating film and a first conductive film are exposed, comprising:
    preparing a workpiece having the underlayer on which the insulating film and a metal film as the first conductive film are exposed;
    selectively growing a second conductive film on the metal film;
    selectively growing a silicon-based insulating film on the insulating film by repeating a cycle a plurality of times, the cycle including:
        a first step of adsorbing an aminosilane-based gas onto the insulating film and the second conductive film; and
        a second step of supplying a reaction gas to the workpiece such that the silicon-based insulating film is formed on the insulating film by the reaction gas acting on the aminosilane-based gas adsorbed onto the insulating film, and the second conductive film is vaporized and reduced in thickness by the reaction gas acting on the second conductive film; and selectively growing the second conductive film,
wherein the selectively growing a silicon-based insulating film and the selectively growing the second conductive film are performed a predetermined number of times.

* * * * *

UNITED STATES PATENT AND TRADEMARK OFFICE
CERTIFICATE OF CORRECTION

PATENT NO. : 10,546,741 B2
APPLICATION NO. : 15/926405
DATED : January 28, 2020
INVENTOR(S) : Hiroki Murakami and Akira Shimizu It is certified that error appears in the above-identified patent and that said Letters Patent is hereby corrected as shown below:

Claim 11, Column 14, Line 1, please delete the phrase "to form".

Signed and Sealed this
Thirty-first Day of March, 2020

Andrei Iancu
*Director of the United States Patent and Trademark Office*